(12) United States Patent
Sridhar et al.

(10) Patent No.: US 6,573,154 B1
(45) Date of Patent: Jun. 3, 2003

(54) HIGH ASPECT RATIO TRENCH ISOLATION PROCESS FOR SURFACE MICROMACHINED SENSORS AND ACTUATORS

(75) Inventors: Uppili Sridhar, Singapore (SG); Ranganathan Nagarajan, Singapore (SG); Yu Bo Miao, Singapore (SG); Yi Su, Webster, NY (US)

(73) Assignee: Institute of Microelectronics, Singapore (SG)

( * ) Notice: Subject to any disclaimer, the term of this patent is extended or adjusted under 35 U.S.C. 154(b) by 21 days.

(21) Appl. No.: 09/696,082

(22) Filed: Oct. 26, 2000

(51) Int. Cl.[7] .................................................. H01L 21/76
(52) U.S. Cl. ........................ 438/430; 438/404; 438/405; 438/431; 438/432
(58) Field of Search .................................. 438/430, 431, 438/432, 404, 405

(56) References Cited

U.S. PATENT DOCUMENTS

| | | | |
|---|---|---|---|
| 4,685,198 A | * | 8/1987 | Kawakita et al. |
| 4,845,048 A | * | 7/1989 | Tamaki et al. |
| 5,116,779 A | * | 5/1992 | Iguchi |
| 5,393,375 A | | 2/1995 | MacDonald et al. ........ 156/643 |
| 5,426,070 A | | 6/1995 | Shaw et al. ................. 437/203 |
| 5,427,975 A | | 6/1995 | Sparks et al. ................ 437/79 |
| 5,549,785 A | | 8/1996 | Sakai et al. ............... 156/644.1 |
| 5,723,353 A | | 3/1998 | Muenzel et al. .............. 437/51 |
| 5,930,595 A | | 7/1999 | Sridhar et al. ................ 438/52 |
| 6,051,866 A | | 4/2000 | Shaw et al. ................. 257/417 |
| 6,110,800 A | * | 8/2000 | Chou ......................... 438/431 |
| 6,136,664 A | * | 10/2000 | Economikos et al. ....... 438/431 |
| 6,174,784 B1 | * | 1/2001 | Forbes ....................... 438/405 |
| 6,316,331 B1 | * | 11/2001 | Tseng ........................ 438/431 |

* cited by examiner

Primary Examiner—John F. Niebling
Assistant Examiner—Ron Pompey
(74) Attorney, Agent, or Firm—George O. Saile; Stephen B. Ackerman

(57) ABSTRACT

A process for fabricating an integrated circuit sensor/actuator is described. High aspect ratio deep silicon beams are formed by a process of deep trench etch and silicon undercut release etch by using oxide spacers to protect the silicon beam sidewalls during release etch. An oxide layer is then formed, followed by deposition of a controlled thickness of polysilicon which is then thermally oxidized. The polysilicon layer inside the trenches gets fully oxidized resulting in void-free trench isolation. This process creates a silicon island or beam on three sides leaving the third side for interfacing with the sensor/actuator beams. The sensor/actuator is formed by a similar process of deep trench etch and release etch process on the same substrate. These suspended beams of the sensors and actuators are bridged with the silicon islands from the fourth side. The above process finally results in suspended silicon beams connected to electrically isolated silicon islands.

20 Claims, 7 Drawing Sheets

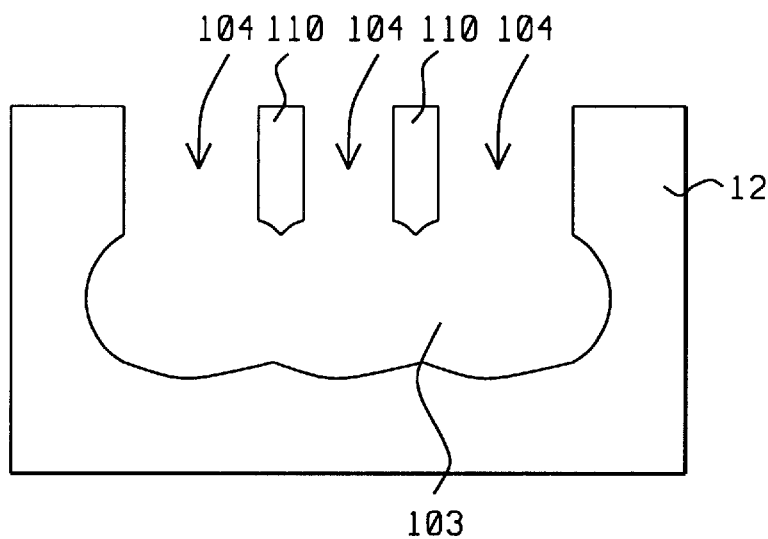
*FIG. 1a – Prior Art*
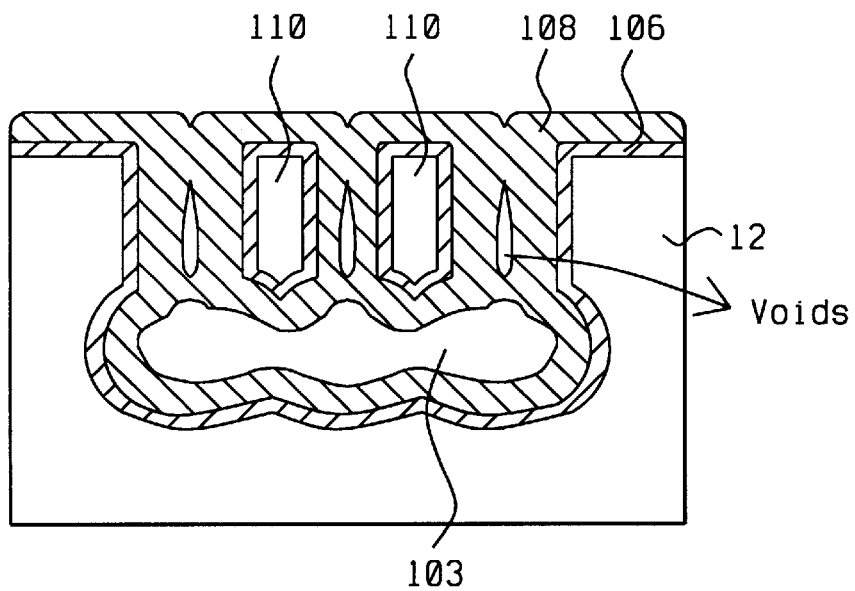
*FIG. 1b – Prior Art*

HIGH ASPECT RATIO TRENCH ISOLATION PROCESS FOR SURFACE MICROMACHINED SENSORS AND ACTUATORS

FIELD OF THE INVENTION

The invention relates to the general field of MEMS with particular reference to filling deep trenches with oxide and with the formation of silicon beams.

BACKGROUND OF THE INVENTION

The fabrication of MicroElectro Mechanical Systems (MEMS) on silicon substrates often necessitates electrical isolation between various suspended. mechanical structures that need to be electrically actuated. In a previous patent (U.S. Pat. No. 5,930,595), we disclosed a deep trench isolation process for sensors and actuators application. The isolation between microstructure and surrounding silicon was realized by oxide filled trenches. That process is suitable for deep trench isolation of up to 10–12 microns. However for higher sensitivity, there is a need for much deeper trenches (40–45 microns). This makes it necessary to have a deeper trench isolation process.

The principal limitation imposed by the process described in U.S. Pat. No. 5,930,595 is illustrated in FIG. 1a. Seen there is silicon body 12 in which deep trenches 104 have been formed. Through use of a release etch, the trench bottoms were widened to form expanded regions 103 which penetrated one another, thereby connecting all trenches and forming silicon islands 110 (FIG. 1b).

The filling of the trenches is illustrated in FIG. 1b. First the trench walls were lined with thermal oxide layer 106. Then filling was completed with the deposition of an oxide layer (TEOS) by means of LPCVD (low pressure chemical vapor deposition). This resulted in the formation of voids such as 109, whose presence is undesirable because of potential reliability problems. The void formation problem increases in severity with increasing trench depth.

A routine search of the prior art was performed. The following references of interest were found:

In U.S. Pat. No. 6,051,866, Shaw et al. show a sensor-process with initial steps similar to the present invention. Muenzel et al in U.S. Pat. No. 5,723,353 teach another sensor isolation system. Sakai et al. (U.S. Pat. No. 5,549, 785) also describe an isolation process. Sparks et al. in U.S. Pat. No. 5,427,975, teach a method for filling trenches with polysilicon but said polysilicon is not oxidizable, being inserted in order to make electrical connections. In U.S. Pat. No. 5,426,070, Shaw et al. discuss the formation of beams in a silicon body by using trenches followed by a release etch step. These trenches do not get filled with oxide. MacDonald et al. (U.S. Pat. No. 5,393,375) show a similar beam formation process.

SUMMARY OF THE INVENTION

It has been an object of the present invention to provide a process for filling a deep trench in a silicon body with silicon oxide.

A further object of the invention has been that said filling process be free of void formation within the filler oxide.

A still further object has been to apply said process to the formation of embedded silicon beams that are surrounded by silicon oxide.

Another object of the invention has been to apply said process to the formation of silicon beams that are partly cantilever and partly embedded in silicon oxide.

These objects have been achieved by means of a process of deep trench etch and silicon undercut release etch by using oxide spacers to protect the silicon beam sidewalls during release etch. An oxide layer is then formed followed by deposition of a pre-determined thickness of polysilicon which is then thermally oxidized. The polysilicon layer inside the trenches gets fully oxidized resulting in void-free trench isolation. This process creates a silicon island on three sides leaving the third side for interfacing with the sensor/actuator beams. The sensor/actuator is formed by a similar process of deep trench etch and release etch process on the same substrate. These suspended beams of the sensors and actuators are bridged with the silicon islands from the fourth side. The above process finally results in suspended silicon beams connected to electrically isolated silicon islands called anchors.

BRIEF DESCRIPTION OF THE DRAWINGS

FIGS. 1a and 1b illustrate how voids form when a deep trench is filled using a process of the prior art.

DESCRIPTION OF THE PREFERRED EMBODIMENTS

As discussed earlier, there is need for deep, oxide-filled, trenches that are free of trapped voids. The present invention achieves this by forming the trench-filling oxide by thermal oxidation. This approach has several advantages (in addition to eliminating void formation). It makes possible the filling of deeper trenches with oxide. By using thermal oxide (as compared to the LPCVD oxide that is standard in the prior art), a less porous oxide of much better quality is obtained. Additionally, the dielectric strength of thermal oxide is better than LPCVD oxide.

For applications involving accelerometers and gyroscopes, the oxide shell that holds the isolation island can be reinforced by a thin unoxidized polysilicon layer. This greatly improves the mechanical stability of the isolation structure for such applications. This new approach can provide excellent trench isolation for 40–50 micron deep trenches with aspect ratios as high as 20.

The process of the present invention will now be disclosed through a description of four embodiments.

First Embodiment

Figure 2:
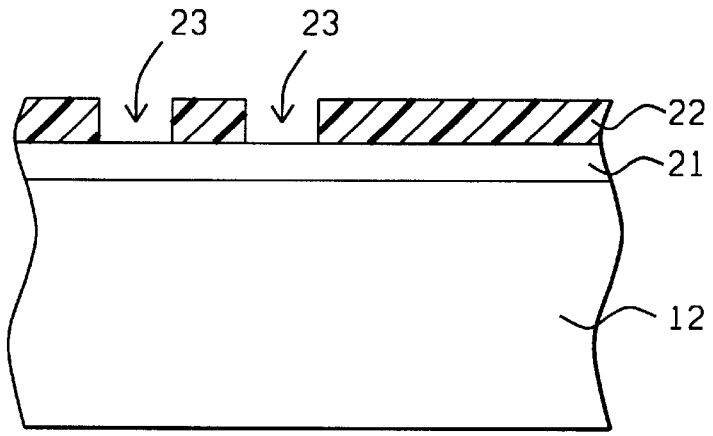
FIGS. 2 through 4 show how the trenches are defined and formed.
Figure 3:
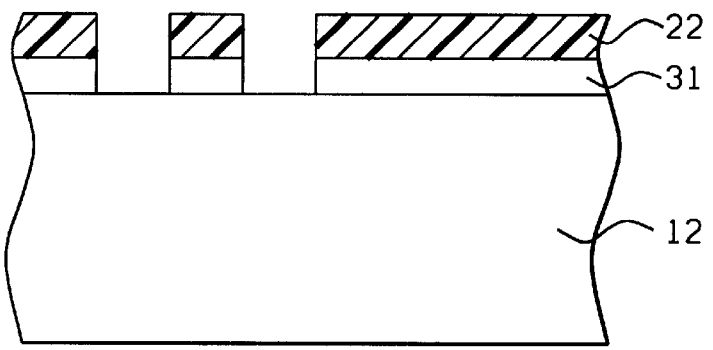
Figure 4A:
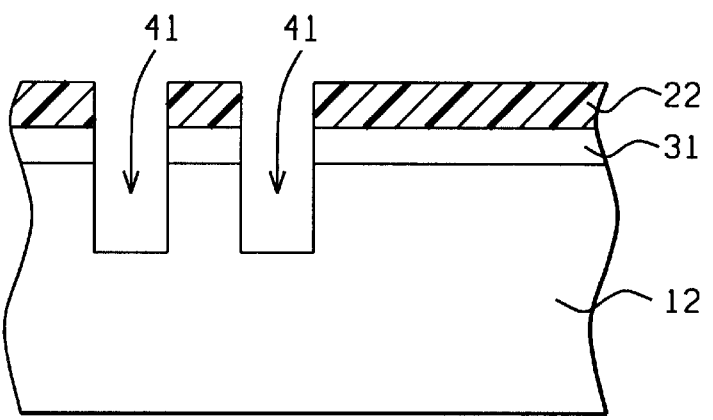
Figure 4B:
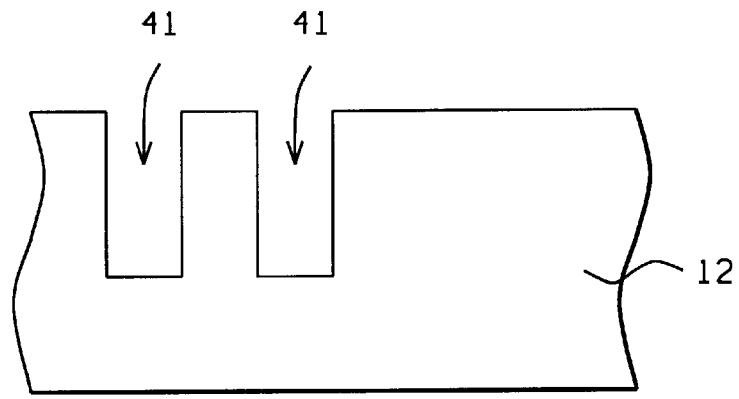

Referring now to FIG. 2, the process of this embodiment begins with the provision of silicon body 12 on whose upper surface silicon oxide layer 21 is deposited. Photoresist layer 22 is then laid down and patterned to form an etch mask that includes openings such as 23 that define the trench. All unprotected silicon oxide is then removed, resulting in the formation of hard mask 31 as seen in FIG. 3.

Using both masks, trenches 41 are then etched to a depth of at least 40–50 microns. The hard mask ensures accurate dimensioning of the trenches even if the photoresist is attacked by the etchant. Etching of the trenches was achieved as follows:

In an STS SCP system, using a cyclical etch process— etching with $SF_6$ (100 SCCM), $O_2$ (10 SCCM), and $C_4F_8$ (40 SCCM); 600 watt coil power, 14 watt platen; 7.5 seconds cycle time; passivating with $C_4F_8$ (180 SCCM); 600 watt coil power; 0.5 seconds cycle time; pressure 22–30 mtorr at 54% valve position, for a total process time between about 40 and 50 minutes (depending on required trench depth), for an etch rate of about 1.2 microns per minute.

Figure 5A:
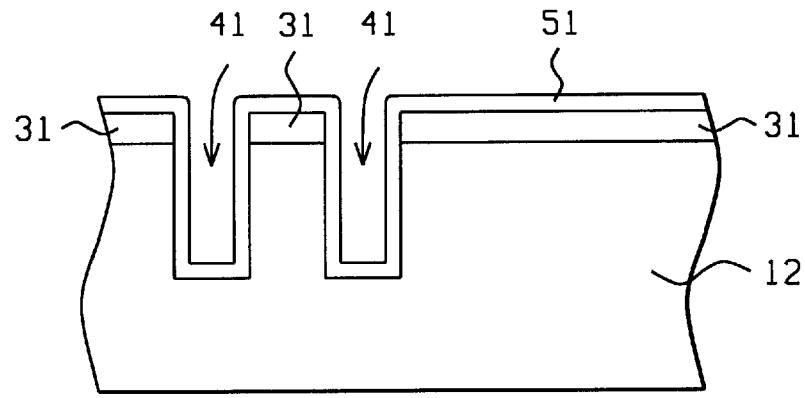
FIG. 5a shows trenches that have been lined with thermal oxide.
Figure 5B:
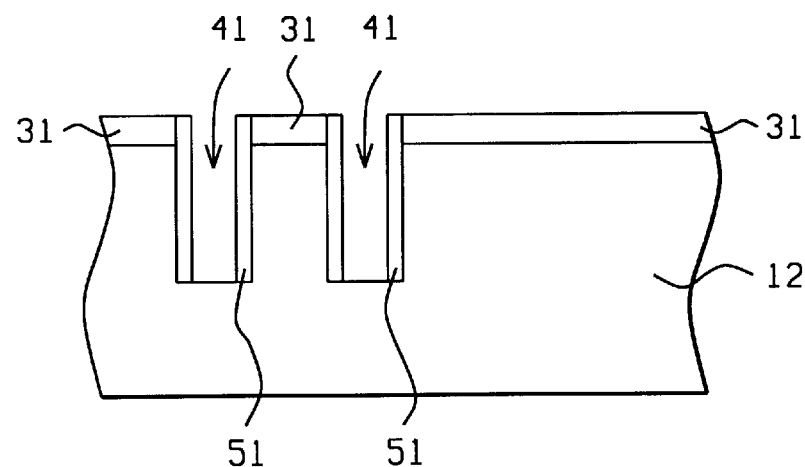
FIGS. 5b and 5c refer to a second embodiment and illustrate how trenches are filled by first depositing, and then thermally oxidizing, polysilicon.
Figure 5C:
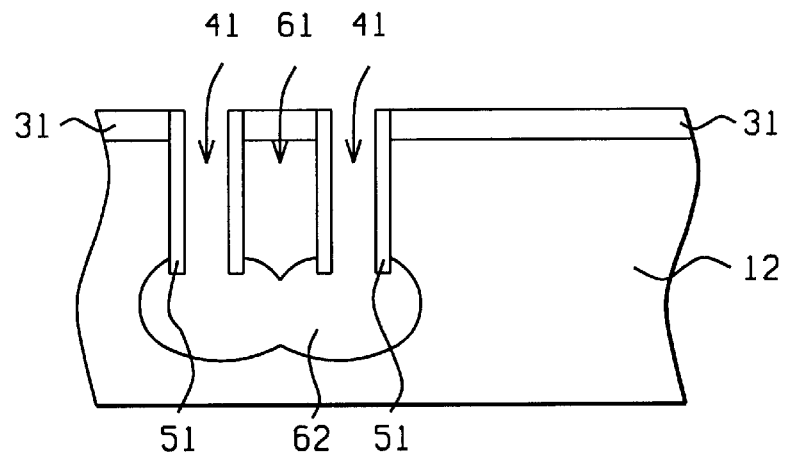
Figure 5D:
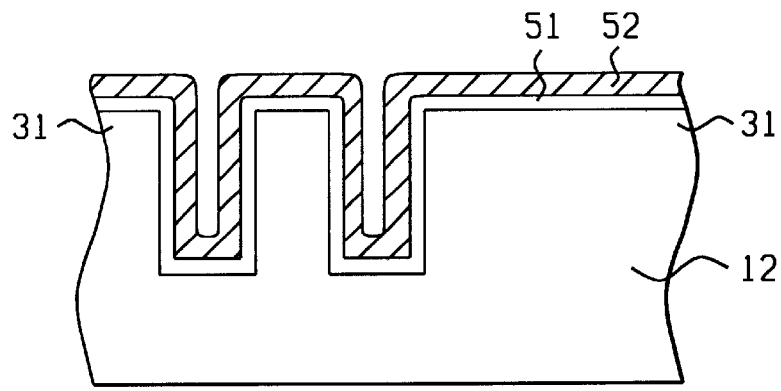
FIG. 5d shows the structure after oxide liner formation and polysilicon deposition.

After removing all photoresist, all silicon oxide (notably hard mask 31) is also removed. This sequence of steps are shown in FIGS. 2, 3, 4a and 4b. Then, a new layer of silicon oxide (layer 51 in FIG. 5d) is formed on all exposed surfaces by means of thermal oxidation or LPC TEOS deposition. Layer 51 has a thickness between about 4,000 and 6,000 Angstroms. This is followed by a key feature of the invention which is the deposition of conformal polysilicon layer 52 over silicon oxide layer 51. The polysilicon is deposited to a thickness between about 4,000 and 6,000 Angstroms by means of the following LPCVD process:

using ASM furnace LB45 at a temperature about 580° C.; pressure about 300 mtorr; with $SiH_4$ at about 165 SCCM, for a deposition rate of about 0.33 microns/minute, deposition time depending on requirements.

Figure 5E:
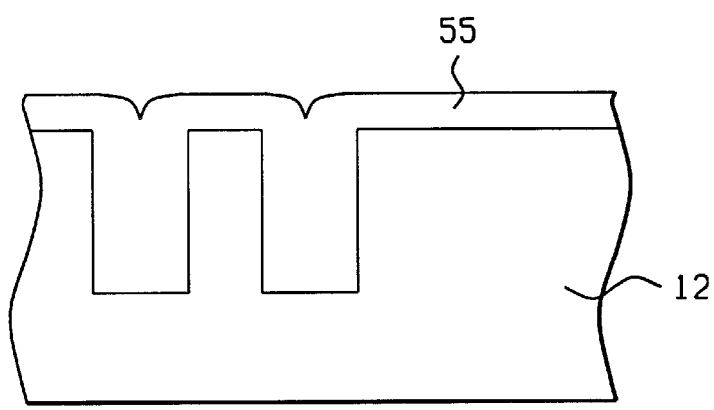
FIG. 5e shows the structure after thermal oxidation of the polysilicon.

As shown in FIG. 5e, in another key step, polysilicon layer 52 is then thermally oxidized though its full thickness by means of wet thermal oxidation. This is achieved by means of a stabilizing temperature of about 700° C. which is ramped up to about 1,050° C., for wet oxidation using oxygen at 500 SCCM and hydrogen at 6 SLPM (standard liters per minute) for as long as needed, followed by a nitrogen anneal (5 SLPM) at about 1,050° C. for about 30 minutes, after which the temperature is ramped back down to about 700° C.

Figure 5F:
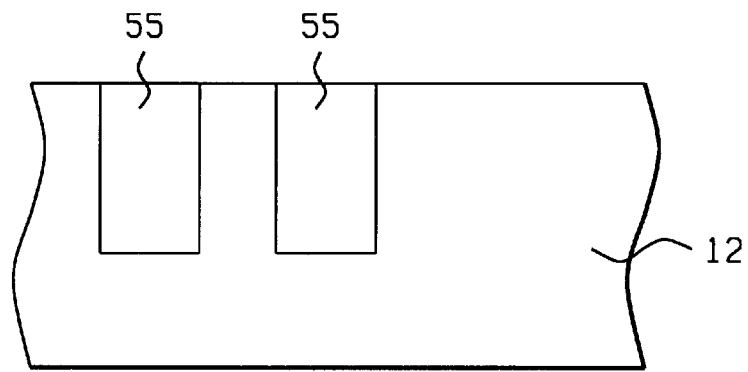
FIG. 5f shows the structure after removal of surface oxide.
Figure 6:
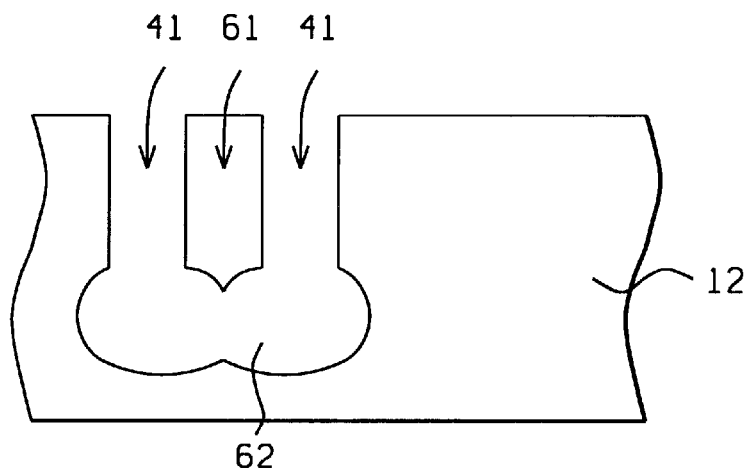
FIG. 6 shows the structure after two adjacent trenches have been connected by means of a release etch thereby forming a beam.

Through careful choice of the thicknesses of layers 51 and 52 (the trench has a width that is between about 2 and 3 times the combined thickness of layers 51 and 52), as the oxide grows, opposing sides of the trench will just meet, causing the trench to fill with oxide 55 and avoiding the formation of any voids. The surface oxide layer can then be removed, giving the final structure the appearance seen in FIG. 5f.

Figure 10:
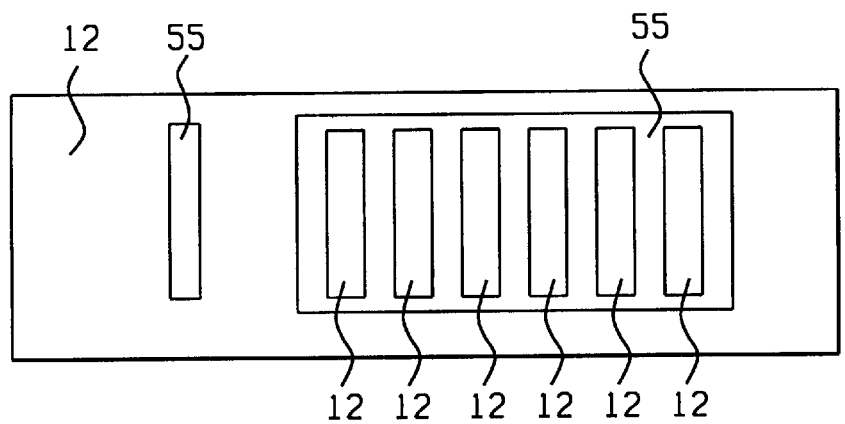
FIGS. 10 through 12 illustrate different silicon beam configurations achieved through application of the present invention.
Figure 11:
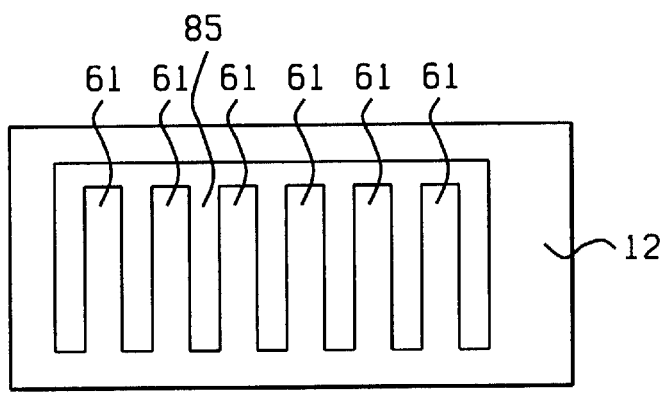

As illustrated in FIG. 10, oxide filled trench 55 can stand alone within silicon body 12 or can take the form of multiply connected trenches that surround a series of silicon beams 12, as shown in FIG. 11.

Second Embodiment

As in the first embodiment, the process of this embodiment begins with the provision of silicon body 12 on whose upper surface silicon oxide layer 21 is deposited. Photoresist layer 22 is then laid down and patterned to form an etch mask that includes openings such as 23 that define the trench. All unprotected silicon oxide is then removed, resulting in the formation of hard mask 31 as seen in FIG. 3.

Using both masks, trenches 41 are then etched to a depth of at least 40–50 microns, The hard mask ensures accurate dimensioning of the trenches even if the photoresist is attacked by the etchant. A typical aspect ratio for the trench would be between about 15 and 25, depending on trench depth and width. Etching of the trenches was achieved by means of a deep RIE process, as follows:

using an STS multiplex ICP system, etching with $SF_6$ (100 SCCM), $O_2$ (10 SCCM), $C_4F_8$ (40 SCCM), 600 watt coil power, and 140 watt platen power. This was followed by passivation in $C_4F_8$ (180 SCCM) with 600 watt coil power for a 5 second cycle time. Pressure was 22–30 mtorr at 54% fixed valve position, for an etch rate of about 1.2 microns/minute, with total etch time depending on required trench depth.

After removing all photoresist, the silicon oxide (notably hard mask 31) is still retained. Then, a new layer of silicon oxide (layer 51 in FIGS. 5a and 5b) is formed on all exposed surfaces by means of thermal oxidation or deposition, following which it is selectively removed from the top and floor of the trench. Layer 51 is deposited to a thickness between about 4,000 and 6,000 Angstroms.

This is followed by the formation of beam 61 (FIG. 5c) which is achieved by subjecting all exposed silicon to a release etch which causes all silicon 62 between the floors of trenches 41 to be removed.

At user's discretion, either of the following processes may be used for the release etch (STS multiplex ICP system}:

| $XeF_2$ release etch | $SF_6$ plasma release etch |
| --- | --- |
| $XeF_2$ 1.6 torr | $SF_6$ 160–200 SCCM |
| pressure 90 mtorr | pressure 30–40 mtorr |
| temperature 10° C. | coil power 1,000 watts |
| time 15–30 minutes | time 2–3 minutes |
| etch rate 1 micron/minute | platen power 10 watts |

Then, all silicon oxide (notably layers 31 and 51) is removed, following which fresh silicon oxide layer 64 is formed on all exposed surfaces by means of thermal oxidation or LPCVD TEOS deposition. The latter consisted of TEOS (about 100 SCCM), at a temperature of about 720° C. and a pressure of about 150 mtorr, for a deposition rate of about 25 Angstroms/minute.

Then, in a key feature of the invention, conformal polysilicon layer 52 is deposited over silicon oxide layer 64. The polysilicon is deposited to a thickness between about 4,000 and 6,000 Angstroms by means of LPCVD ($SiH_4$ at 165 SCCM, at about 580° C. and a pressure of about 300 mtorr) for a deposition rate of about 0.33 microns/minute.

Figure 8:
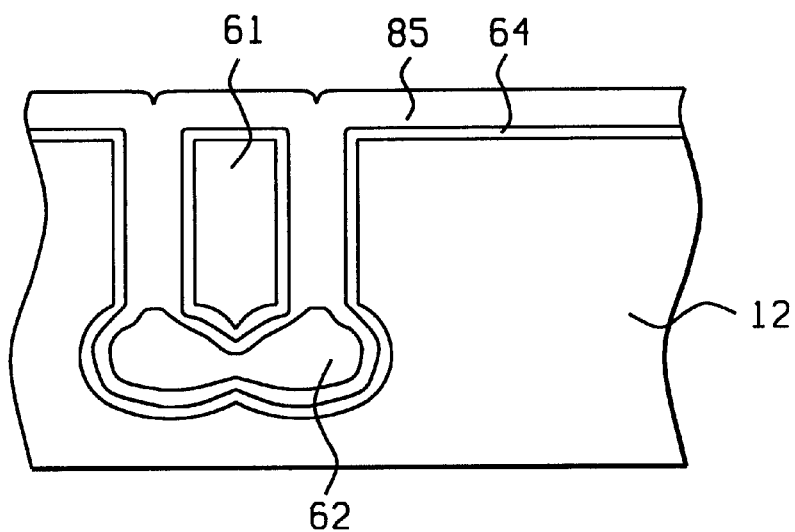

As shown in FIG. 8, in another key step, polysilicon layer 52 is then thermally oxidized though its full thickness by means of wet thermal oxidation. This is achieved by means of a stabilizing temperature of about 700° C. which is ramped up to about 1,050° C., for wet oxidation using oxygen at 500 SCCM and hydrogen at 6 SLPM (standard liters per minute) for as long as needed, followed by a nitrogen anneal (5 SLPM) at about 1,050° C. for about 30 minutes, after which the temperature is ramped back down to about 700° C.

Through careful choice of the thicknesses of layers 51 and 52 (the trench has a width that is between about 2.5 and 3 times the combined thickness of layers 51 and 52), as the oxide grows, opposing sides of the trench will just meet, causing the trench to fill with oxide 85 and avoiding the formation of any voids. This is illustrated in FIG. 8. The surface portion of 85 can then be removed, giving the final structure the appearance seen in FIG. 9.

As illustrated in FIG. 11, a plurality of silicon beams 61 may be formed. These are anchored to main silicon body 12 at one end and are surrounded everywhere else (except their top surface) by silicon oxide 85.

Third Embodiment

Figure 9:
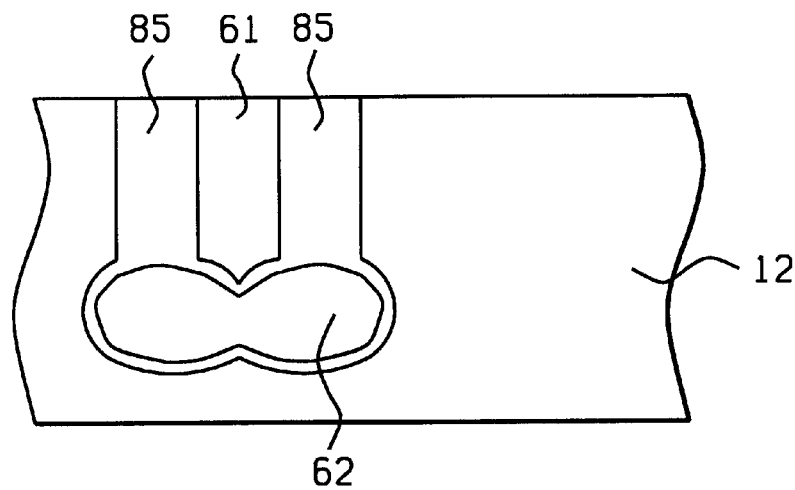
FIG. 9 shows the structure of FIG. 8 after removal of surface oxide.
Figure 12:
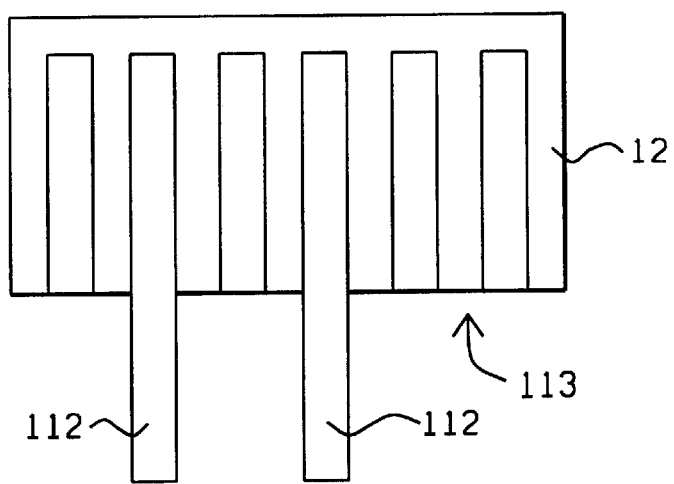

This embodiment is similar to the second embodiment but with additional process steps after the structure has reached the stage illustrated in FIG. 9. This additional processing comprises the formation of a cantilever beam (such as 112 in FIG. 12) by masking the upper surface 113 (seen here as a lower surface with mask not shown) and then etching unprotected parts of surface 113 so that part of the beam becomes cantilever 112, which extends away from surface 113, as shown.

Fourth Embodiment

Figure 7:
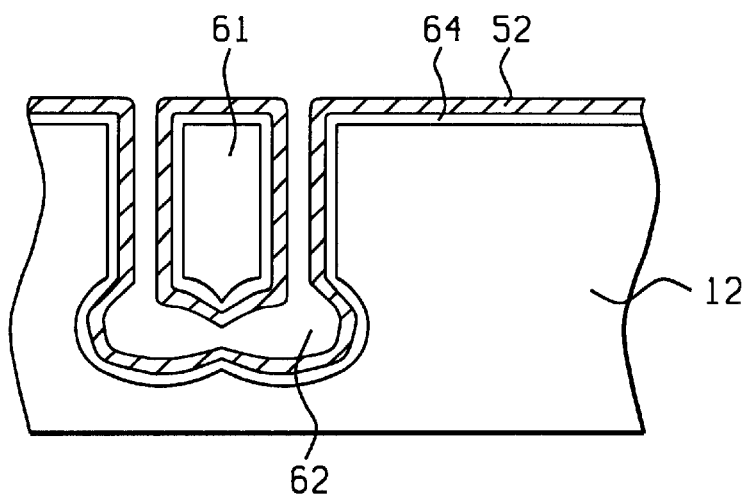
FIGS. 7 and 8 refer to embodiments two through four and illustrate how trenches are filled by first depositing, and then thermally oxidizing, polysilicon.

This embodiment is also similar to the second embodiment, but with one key difference. After the polysilicon layer 52 has been laid down, as illustrated in FIG. 7, the next step of fully oxidizing it by means of wet thermal oxidation, is modified to only partial oxidation so that, instead of filling the trench entirely with silicon oxide, it becomes filled with a laminate of silicon oxide-polysilicon-silicon oxide (not shown) that has greater mechanical strength than silicon oxide alone. Said laminate surrounds the silicon beam on four sides and, as in the oxide only case, is free of voids.

As in the earlier embodiments, the trench has a width that is between about 2.5 and 3 times the combined thickness of silicon oxide layer 64 and the polysilicon layer 52, while silicon oxide layer 64, the remaining (unoxidized) polysilicon layer, and the oxidized polysilicon layer that form the laminate, have relative thicknesses of about 5,000 to 1,000 to 8,000 Angstroms, respectively.

While the invention has been particularly shown and described with reference to the preferred embodiments thereof, it will be understood by those skilled in the art that various changes in form and details may be made without departing from the spirit and scope of the invention.

What is claimed is:

1. A process for forming a deep, oxide filled trench in a silicon body having an upper surface, comprising the sequential steps of:

depositing a first layer of silicon oxide on said upper surface;

on said first silicon oxide layer forming a photoresist mask that defines the trench;

etching all unprotected first silicon oxide, thereby forming a hard mask;

etching all silicon not covered by said hard mask to a depth of at least 50 microns, thereby forming the trench, said trench having a floor;

removing all photoresist;

removing all silicon oxide;

by means of thermal oxidation, forming a second silicon oxide layer on all exposed surfaces;

depositing a single conformal layer of polysilicon, whose thickness is no more than about 1% of said trench depth, over said second silicon oxide layer; and by means of wet thermal oxidation, fully oxidizing said layer of polysilicon thereby filling the trench with silicon oxide that is free of voids.

2. The process described in claim 1 wherein the second silicon oxide layer is deposited to a thickness between about 4,000 and 6,000 Angstroms.

3. The process described in claim 1 wherein the polysilicon layer is deposited to a thickness between about 4,000 and 6,000 Angstroms.

4. The process described in claim 1 wherein the step of depositing the polysilicon layer further comprises using $SiH_4$ at a flow rate of about 165 SCCM, a temperature of about 580° C., and a pressure of about 300 mtorr for a deposition rate of about 0.33 microns per minute.

5. The process described in claim 1 wherein the step of fully oxidizing said layer of polysilicon, by means of wet thermal oxidation, further comprises:

providing a stabilizing temperature of about 700° C.;

ramping the temperature up to about 1,050° C.;

admitting oxygen at about 500 SCCM and hydrogen at about 6 SLPM;

annealing in nitrogen at about 1,050° C. for about 30 minutes; and then ramping the temperature back down to about 700° C.

6. The process described in claim 1 wherein the trench has a width that is between about 2.5 and 3 times the combined thickness of the second silicon oxide layer and the polysilicon layer.

7. A process for forming, within a silicon body that has an upper surface, a silicon beam surrounded on four sides by silicon oxide, comprising the sequential steps of:

depositing a first layer of silicon oxide on said upper surface;

on said first silicon oxide layer forming a photoresist mask that defines a trench shape that surrounds the beam on three sides, two of which oppose one another;

etching all unprotected first silicon oxide, thereby forming a hard mask;

etching all silicon not covered by said hard mask, thereby forming the trench, said trench having a floor;

removing all photoresist;

depositing a second silicon oxide layer on all exposed surfaces;

selectively removing the second silicon oxide layer from the floor of the trench;

subjecting all exposed silicon to a release etch whereby all silicon between the floors of said apposing trench sides is removed, thereby forming the beam;

removing all silicon oxide;

by means of thermal oxidation, forming a third silicon oxide layer on all exposed surfaces;

depositing a single conformal layer of polysilicon, whose thickness is no more than about 1% of said trench depth, over said third silicon oxide layer; and by means of wet thermal oxidation, fully oxidizing said layer of polysilicon thereby filling the trench with silicon oxide that is free of voids and forming a silicon beam surrounded on four sides by silicon oxide.

8. The process described in claim 7 wherein the trench has an aspect ratio between about 15 and 25.

9. The process described in claim 7 wherein the step of subjecting all exposed silicon to a release etch further comprises using $XeF_2$ at 1.6 torr, at a pressure of 90 mtorr and a temperature of about 10° C. for between about 15–30 minutes, thereby achieving an etch rate of about 1 micron/minute; or using SF$_6$ at about 160–200 SCCM, at a pressure of about 30–40 mtorr, a coil power of about 1,000 watts and a platen power of about 10 watts for 2–3 minutes.

10. The process described in claim 7 wherein the step of depositing a second silicon oxide layer is wet oxidation that further comprises:

providing a stabilizing temperature of about 700° C.;

ramping the temperature up to about 1,050° C.;

admitting oxygen at about 500 SCCM and hydrogen at about 6 SLPM;

annealing in nitrogen at about 1,050° C. for about 30 minutes; and then ramping the temperature back down to about 700° C.

11. The process described in claim 7 wherein the polysilicon layer is deposited to a thickness between about 4,000 and 6,000 Angstroms.

12. The process described in claim 7 wherein the step of depositing the polysilicon layer further comprises using SiH$_4$ at a flow rate of about 165 SCCM, a temperature of about 580° C., and a pressure of about 300 mtorr for a deposition rate of about 0.33 microns per minute.

13. The process described in claim 7 wherein the step of fully oxidizing said layer of polysilicon, by means of wet thermal oxidation, further comprises:

providing a stabilizing temperature of about 700° C.;

ramping the temperature up to about 1,050° C.;

admitting oxygen at about 500 SCCM and hydrogen at about 6 SLPM;

annealing in nitrogen at about 1,050° C. for about 30 minutes; and then ramping the temperature back down to about 700° C.

14. The process described in claim 7 wherein the trench has a width that is between about 2.5 and 3 times the combined thickness of the second silicon oxide layer and the polysilicon layer.

15. A process for forming, within a silicon body that has an upper surface, a silicon beam, part of which is surrounded on all sides by silicon oxide and part of which extends away from said surface as a cantilever beam, comprising the steps of:

depositing a first layer of silicon oxide on said upper surface;

on said first silicon oxide layer forming a photoresist mask that defines a trench shape that surrounds the beam on three sides, two of which oppose one another;

etching all unprotected first silicon oxide, thereby forming a hard mask;

etching all silicon not covered by said hard mask, thereby forming the trench, said trench having a floor;

removing all photoresist;

depositing a second silicon oxide layer on all exposed surfaces;

selectively removing the second silicon oxide layer from the floor of the trench;

subjecting all exposed silicon to a release etch whereby all silicon between the floors of said apposing trench sides is removed, thereby forming the beam;

removing all silicon oxide;

by means of thermal oxidation, forming a third silicon oxide layer on all exposed surfaces;

depositing a single conformal layer of polysilicon, whose thickness is no more than about 1% of said trench depth, over said third silicon oxide layer;

by means of wet thermal oxidation, fully oxidizing said layer of polysilicon thereby filling the trench with silicon oxide that is free of voids and forming a silicon beam surrounded on four sides by silicon oxide; and masking the silicon beam at the upper surface and then etching unprotected parts of the upper surface so that part of the beam becomes a cantilever which extends away from said surface.

16. The process described in claim 15 wherein the cantilever part of the beam extends away from the surface for a distance of between about 100 and 500 microns.

17. The process described in claim 15 wherein the trench has a width that is between about 2.5 and 3 times the combined thickness of the third silicon oxide layer and the polysilicon layer.

18. A process for forming, within a silicon body that has an upper surface, a silicon beam, part of which is surrounded on all sides by silicon oxide and part of which extends away from said surface as a cantilever beam, comprising the steps of:

depositing a first layer of silicon oxide on said upper surface;

on said first silicon oxide layer forming a photoresist mask that defines a trench shape that surrounds the beam on three sides, two of which oppose one another;

etching all unprotected first silicon oxide, thereby forming a hard mask;

etching all silicon not covered by said hard mask, thereby forming the trench, said trench having a floor;

removing all photoresist;

depositing a second silicon oxide layer on all exposed surfaces;

selectively removing the second silicon oxide layer from the floor of the trench;

subjecting all exposed silicon to a release etch whereby all silicon between the floors of said apposing trench sides is removed, thereby forming the beam;

removing all silicon oxide;

by means of thermal oxidation, forming a third silicon oxide layer on all exposed surfaces;

depositing a conformal layer of polysilicon over said third silicon oxide layer;

by means of wet thermal oxidation, partially oxidizing said layer of polysilicon thereby filling the trench with a laminate of silicon oxide-polysilicon-silicon oxide that is free of voids, said laminate having greater mechanical strength than silicon oxide alone and a total thickness that is no more than about 1% of said trench's depth, thereby forming a silicon beam surrounded on four sides by said laminate; and masking the silicon beam at the upper surface and then etching unprotected parts of the upper surface so that part of the beam becomes a cantilever which extends away from said surface.

19. The process described in claim 18 wherein the trench has a width that is between about 2.5 and 3 times the combined thickness of the third silicon oxide layer and the polysilicon layer prior to said wet oxidation step.

20. The process described in claim 18 wherein, the third silicon oxide layer, the polysilicon layer, and the oxidized polysilicon layer that form the laminate, have relative thicknesses of about 5,000 to 1,000 to 8,000 Angstroms, respectively.

* * * * *